(12) United States Patent
Touwslager et al.

(10) Patent No.: US 8,673,702 B2
(45) Date of Patent: Mar. 18, 2014

(54) FIELD SHIELD DIELECTRIC AS A MASK DURING SEMICONDUCTOR INK JET PRINTING

(75) Inventors: Fredericus Johannes Touwslager, Veldhoven (NL); Gerwin Hermanus Gelinck, Valkenswaard (NL)

(73) Assignee: Creator Technology B.V., Breda (NL)

( * ) Notice: Subject to any disclaimer, the term of this patent is extended or adjusted under 35 U.S.C. 154(b) by 747 days.

(21) Appl. No.: 12/063,398

(22) PCT Filed: Aug. 4, 2006

(86) PCT No.: PCT/IB2006/052700
§ 371 (c)(1),
(2), (4) Date: Mar. 20, 2008

(87) PCT Pub. No.: WO2007/020553
PCT Pub. Date: Feb. 22, 2007

(65) Prior Publication Data
US 2009/0065782 A1  Mar. 12, 2009

Related U.S. Application Data

(60) Provisional application No. 60/708,084, filed on Aug. 12, 2005.

(51) Int. Cl.
*H01L 21/84* (2006.01)
(52) U.S. Cl.
USPC ........... 438/158; 438/694; 438/714; 438/758; 438/780; 257/72; 257/642; 257/E33.044; 257/E21.488; 257/E21.492; 257/E21.299
(58) Field of Classification Search
USPC ............... 438/158, 780, 758, 455, 714, 694; 257/72, 642, E33.044, E21.488, 257/E21.492, E21.299
See application file for complete search history.

(56) References Cited

U.S. PATENT DOCUMENTS

| | | | | |
|---|---|---|---|---|
| 6,413,790 | B1 * | 7/2002 | Duthaler et al. | 438/21 |
| 6,498,114 | B1 * | 12/2002 | Amundson et al. | 438/780 |
| 7,989,806 | B2 * | 8/2011 | Huitema et al. | 257/59 |
| 2002/0126243 | A1 * | 9/2002 | Hibino et al. | 349/122 |
| 2003/0194825 | A1 * | 10/2003 | Law et al. | 438/30 |
| 2006/0081849 | A1 * | 4/2006 | Lee et al. | 257/72 |

FOREIGN PATENT DOCUMENTS

JP  2004-349640 A  9/2004
KR  10-2001-0008858  2/2001

OTHER PUBLICATIONS

Gelinck et al., Making Rollable Displays, Information Displays Nov. 2004, p. 12-14.*
Van Lieshout, et al., *System-on-Plastic with Organic Electronics: A Flexible QVGA Display and Integrated Drivers*, SID 04 Digest, pp. 1290-1293, Phillips Research Laboratories, Eindhoven, The Netherlands.
Gelinck et al., *Making Rollable Displays*, Information Display Nov. 2004, pp. 12-14.
Korean Intellectual Property Office, Office Action, Patent Application Serial No. 10-2008-7005823, Nov. 28, 2012, Korea.

* cited by examiner

*Primary Examiner* — Alexander Sofocleous
*Assistant Examiner* — John P Dulka

(57) ABSTRACT

A display device and method for fabricating includes patterning a field shield dielectric layer to expose conductors and form a cavity over the conductors. InkJet printing a semiconductor material fills a portion of the cavity in contact with the conductors. An insulation material is deposited on the semiconductor material. A pixel pad is formed over the insulation material and the field shield dielectric layer. A pixel is formed which includes a thin film transistor with an ink jet printed semiconductor layer.

22 Claims, 5 Drawing Sheets

FIELD SHIELD DIELECTRIC AS A MASK DURING SEMICONDUCTOR INK JET PRINTING

FIELD OF THE INVENTION

This disclosure relates to pixel displays and more particularly to an apparatus and method which includes a field shield and employs field shield dielectric during processing.

BACKGROUND

Cells or capsules containing electronic ink react to voltages placed on them and are used for generating images. A capsule may typically include white and black electronic ink particles. The ink is reactive and moves in accordance with the voltage applied to the capsule or cell. To change image content on an electrophoretic electronic ink display, new image information is written for a certain amount of time (e.g., 500 ms-1000 ms). As the refresh rate of an active-matrix is usually higher, this results in addressing the same image content during a number of frames (e.g., at a frame rate of 50 Hz, 25 to 50 frames).

Referring to FIG. 1, a schematic drawing of the electronic-ink capsule 12 is illustratively shown. Addressing of electronic ink from black to white, for example, requires pixel capacitor plates 10a and 10b to be charged to −15 V during a 500 ms to 1000 ms interval. During this time the white particles drift towards the top (common) electrode, while the black particles drift towards the bottom (active-matrix back plane) electrode. Switching to black requires a positive pixel voltage. At 0 V on the pixel capacitor the electronic ink does not switch.

These display arrangements often include complex processing steps. With each generation of active matrix display, increased processing complexity of the active matrix is experienced, which has a negative influence on the price. For example, the semiconductor is the most expensive layer in an active matrix backplane and the costs may exceed around €620 per display for materials alone.

Therefore, a need exists to reduce both material cost and processing complexity in active matrix displays.

SUMMARY OF THE INVENTION

The present invention provides for reductions in material cost and processing complexity by including a field shield and a method for forming and using the field shield dielectric to reduce costs of an active matrix display. A reduction in material use of, e.g., the semiconductor material used in such displays may reduce the cost of material by, say, two to three orders of magnitude. One way to reduce the processing complexity may include exchanging one lithographic step by an ink jetting step. This ink jetting becomes feasible due to the presence of a field shield insulator layer used with the field shield.

A display device and method for fabricating in accordance with the present invention includes patterning a field shield dielectric layer to expose conductors and form a cavity over the conductors. Inkjet printing a semiconductor material fills a portion of the cavity in contact with, enveloping or burying the conductors. An insulation material is deposited on the semiconductor material. A pixel pad is formed over the insulation material and the field shield dielectric layer. A pixel is formed which includes a thin film transistor with an ink jet printed semiconductor layer.

Another method for fabricating a display device includes forming a gate electrode, depositing a first insulation layer over the gate electrode, and depositing a first conductive layer and patterning the first conductive layer to form data lines on the first insulation layer over the gate electrode. A field shield dielectric layer is deposited and patterned to expose the data lines and form a cavity over the gate electrode. A semiconductor material is ink jetted to fill a portion of the cavity and envelop the data lines. A second insulation material is deposited on the semiconductor material, and a second conductive layer is formed over the second insulation material and the field shield dielectric layer.

In alternate embodiments, a second insulation material is deposited on the semiconductor material by ink jet printing. The data lines may form a source of a thin film transistor employed to turn a pixel on and off. The step of patterning a field shield dielectric may include forming a cavity for a vertical interconnect. The step of forming a second conductive layer may include forming the vertical interconnect using the second conductive layer. The step of forming a second conductive layer may include depositing the second conductive layer by physical vapor deposition. The step of forming a second conductive layer may include forming a pixel pad/field shield which extends over at least a portion of a thin film transistor formed using the semiconductor material.

A display device includes a thin film field effect transistor which selectably couples a signal to address a pixel, the thin film transistor including an ink jet printed semiconductor layer which covers source and drain conductors and a pixel pad forming a field shield, the pixel pad being formed on an insulating layer and connected to the transistor through the insulating layer such that the field shield extends over at least a portion of the transistor. Other aspects may include an ink jet printed insulation layer deposited on the semiconductor layer to separate the semiconductor layer from the pixel pad. The ink jet printed insulation layer and the semiconductor layer may be printed in a same cavity. The thin film transistor may include a gate electrode and the field shield may be disposed over the thin film transistor to form a second gate electrode. A vertical interconnect may be formed from a same material as the pixel pad The display device may be flexible.

To increase the lifetime of electronic ink it is desirable to switch to a field shielded design. A consequence of this design is that two mask steps have to be added. One extra mask step is needed to structure the field shield dielectric, and one in needed to structure the top metal layer. In this invention the structured dielectric is used as a mask to enable the ink jet printing of the semi-conductor. Thereby the lithographic structuring of the semi conductor can be replaced by an ink jet step.

These and other objects, features and advantages of the present disclosure will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein.

DETAILED DESCRIPTION OF THE DRAWINGS

The present disclosure describes exemplary embodiments, which include using ink jet printing as a deposition technique on non-porous substrates without the need for a surface pretreatment to prevent the applied droplets from spreading. One aspect of the present invention uses cavities made in a field shield insulator as a mask to aid the local application of a semiconductor material. Next, an insulator is applied in the cavities followed by, for example, vapor deposition of a top conductive layer. Also, vertical interconnects may be made using this approach.

Embodiments described herein are applicable to active matrices display devices. These devices may be employed for a plurality of different application on numerous different platforms. Particularly useful embodiments include flexible display devices with organic materials. While the present disclosure will describe illustrative display devices and elements, the present invention is not limited to these illustrative embodiments.

Figure 2:
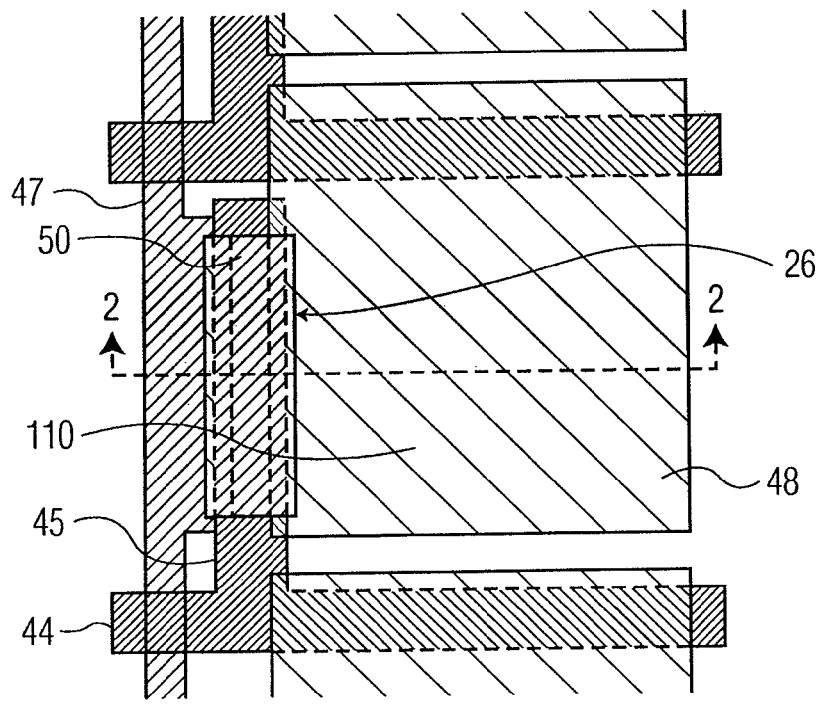
FIG. 2 is a top view of a pixel cell for an active matrix display including an E ink display.
Figure 3:
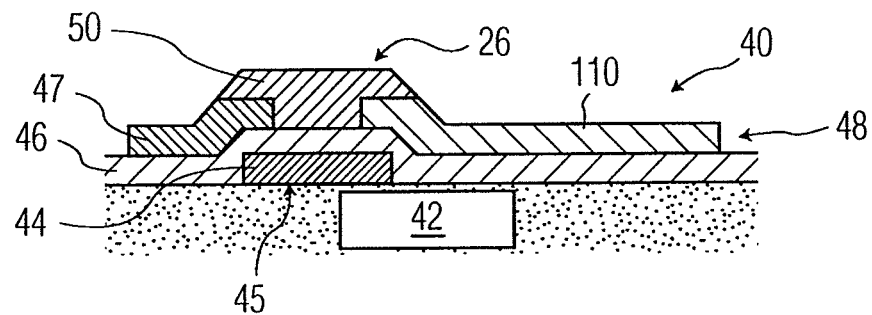
FIG. 3 is a cross-sectional view taken at section line 2-2 of FIG. 2 showing an illustrative stack for the active display pixel cell.

Referring now to the drawings in which like numerals represent the same or similar elements and initially to FIGS. 2 and 3, a stack 40 may be used in organic TFTs pixel circuits. An active-matrix device as shown in FIGS. 2 and 3 is processed on, for example, plastic foils 42 (substrate) resulting in an active-matrix (AM) backplane that can be integrated into, e.g., a flexible display. Possible materials that can be used for the various layers are shown in Table 1. The preferred stack 40 starts with a highly conductive gate layer 44 (e.g. noble metal or indium-tin oxide), followed by an organic insulator layer 46, a second conductive layer 48 and an organic semiconducting layer 50. The organic layers 46 and 50 are preferably deposited by spin-coating. The layers can be patterned by photolithography, either by use of the intrinsic photosensitivity of the layers (e.g. the insulator layer) or by use of a photoresist (e.g. for most of the semiconductors and conductors). Layer 48 forms a column electrode 47 and a pixel pad 110, and layer 44 forms the row electrode 45.

Table 1 shows illustrative materials which may be used for an active-matrix circuit with polymer electronics

| Layer | Material |
| --- | --- |
| Substrate* | Polycarbonate, Polyethylene naphtalene, . . . |
| Gate line | Au, Al, Cu, Indium-tin oxide . . . |
| Insulator layers | Photoresist: HPR504, SC100, BCB, SU8 . . . |
| Data line/Pixel pad | Metal: Au, Pd, Pt, ZnSnO3, SnO2:F, Ag . . . |
| Semiconductor | Poly-(thienylene vinylene), pentacene, . . . |

*Base material that can be coated with a number of barrier layers

Stack 40 may be employed as a basis for providing features in accordance with the present invention. Stack 40 may be replaced with other pixel circuits and may still benefit from the teachings of the present invention.

Figure 4:
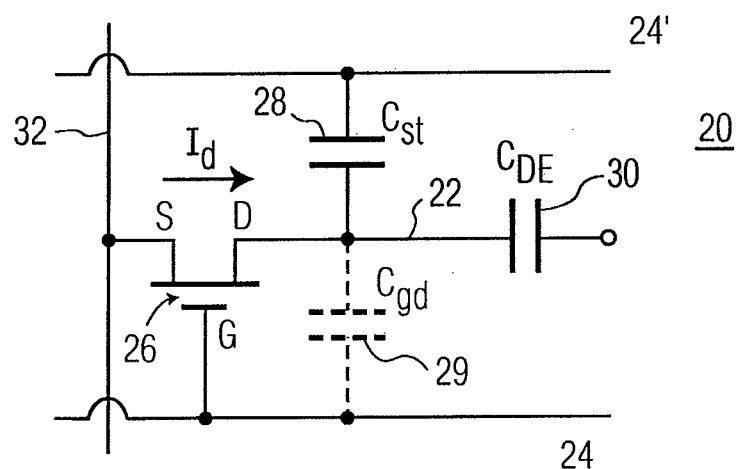
FIG. 4 is a schematic diagram showing an equivalent circuit for the pixel cell for the active matrix display shown in FIGS. 2 and 3.
Figure 5:
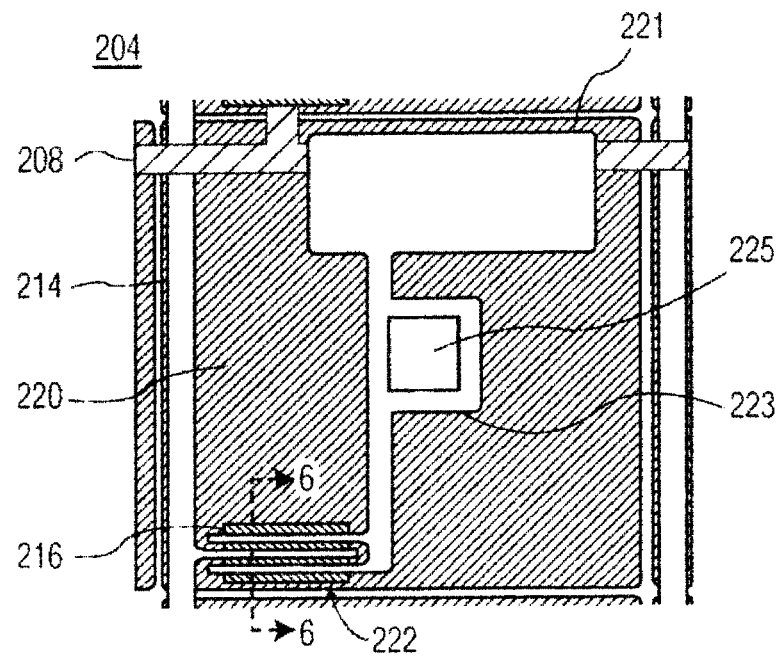
FIG. 5 is a top view of a pixel cell for an active matrix display including a field shield and ink jet printed semiconductor layer in accordance with one embodiment

Referring to FIG. 4, an equivalent circuit 20 of a pixel 22 in an active-matrix display is shown. A row electrode 24 forms a storage capacitor for the pixels in a previous row (e.g., storage capacitor line 24' for this cell). Active-matrix displays may be driven a row-at-a-time. During one frame time, all the rows are sequentially selected by applying a voltage that changes thin film transistors (TFTs) 26 from a non-conducting state (e.g., +25V) to a conducting state (e.g., −25V) with current $I_d$. In this line selection time, the storage capacitor 28, the gate-drain capacitor 29 and the pixel capacitor 30 (i.e. the total capacitance at the drain side of the TFT) of the selected row are charged to the voltage supplied on a column electrode 32 (e.g., +/−15V, 0V). During the remaining frame time (i.e. the hold time), the other rows are addressed. The TFTs 26 are then in their non-conducting state and the charge on the pixel capacitor 30 is retained. This puts severe requirements on TFT's on- and off-current Between image updates, the active-matrix is at rest at 0 V for the row and column electrodes, the pixel pads and the common electrode.

$C_{DE}$ is the capacitor 30 providing the display effect, $C_{st}$ is the storage capacitor 28 and $C_{gd}$ is a parasitic gate-drain capacitor 29 in the TFT 26. In the circuit 20, the previous row electrode forms the storage capacitor line 24'.

Figure 1:
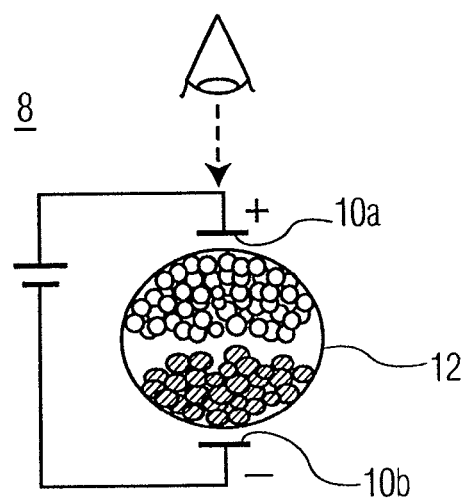
FIG. 1 is a schematic diagram showing an E ink display.

Referring again to FIG. 2, in one embodiment, stack 40 is employed in a flexible polymer-electronics electronic ink display including a plurality of pixel cells. The display may include two parts. A first part includes an active-matrix back plane having polymer electronics thin-film transistors (TFTs) 26. A second part includes an electrophoretic (e.g. electronic ink) display effect that is laminated on top of the back plane shown schematically in FIG. 1. The active-matrix (AM) circuit (the polymer electronics stack 40) is processed on plastic foils or substrate 42, resulting in an AM backplane that can be integrated into a flexible display.

The layers of stack 40 are preferably patterned by photolithography, either by use of the intrinsic photosensitivity of the layers (e.g. the insulator layers) or by use of a photoresist (e.g. for most of the semiconductors and conductors). During the photolithography process protons are generated. These protons (or in some other ionic form) are still present in the layers after processing, and cause bias-instabilities in the final device. While the devices are extensively washed with ion-free water to drive out these (and other) ions, and even though this gives significant improvements, the final device may still suffer from limited operational lifetime. The reduction in the number of photolithography processes may be advantageous.

Referring again to FIG. 1, an electrophoretic display effect for a display 8 uses black and white microparticles, which are responsive to voltages applied to the capsule 12. To change image content on an electrophoretic electronic ink display 8, the new image information is written for a certain amount of time (500 ms-1000 ms). As the refresh rate of the active-matrix is usually higher this results in addressing the same image content during a number of frames (e.g., at a frame rate of 50 Hz, 25 to 50 frames). Addressing of E-ink from black to white, for example, includes the pixel capacitors being charged to −15 V during 500 ms to 1000 ms. During this time the white particles drift towards the top (common) electrode, while the black particles drift towards the bottom (active-matrix back plane) electrode. Switching to black includes a positive pixel voltage and at 0 V on the pixels, electronic ink does not switch.

As the electrophoretic display effects are bi-stable, the back plane only needs to be driven during an image update. Between image updates the pixel switches on the back plane are not driven. The drive voltages for electronic ink are relatively high compared to standard liquid crystal (LC) effects. The polymer electronics devices on the active-matrix back plane should therefore be driven at relatively high voltages.

For polymer electronics active-matrix back planes with E-ink, the voltages may include a row select voltage of about −25 V, a row non-select voltage of +25 V, a column voltage between −15 V and +15 V and a common electrode voltage of 2.5 V. These are relatively high voltages, due to the high voltage E ink display effect and the fact that polymer electronics devices have to be driven at somewhat higher voltages compared to amorphous silicon devices. The advantage of using electronic ink as the display effect instead of LC material is that electronic ink is bi-stable. Addressing is therefore only necessary during an image update (~1 sec), while the active-matrix is at rest between image updates. The disadvantage of using electronic ink is that one cannot apply frame inversion; i.e. apply alternatively positive and negative voltages on the columns (data lines) in subsequent frames. This is commonly done in conventional LCDs to minimize the effect of ionic drift.

As shown in FIG. 4, a storage capacitor 28 is used. It is used so that the requirements on TFT off-current are not too low. One drawback of the storage capacitor is that it couples to the TFT 26 of a next row, so that during row-to-row addressing, this TFT can experience a 90V kickback. From measurements on discrete TFTs and capacitors, these large voltages cause large threshold voltage shifts and eventually hard electrical breakdown.

Due to the large voltage swing on the gate and data lines, the electronic ink deteriorates. Advantageously, a field shield is provided in accordance with one embodiment of the present invention to counter the large voltage swing (e.g., the kickback voltage). Compared to designs without a field shield, a field shield may need two additional mask steps during fabrication. This increase in complexity can be used advantageously by using the structured field shield insulator layer as a mask for the deposition of the semiconductor using ink jetting. In one embodiment, one of the mask steps can be replaced by using ink jetting.

Figure 6:
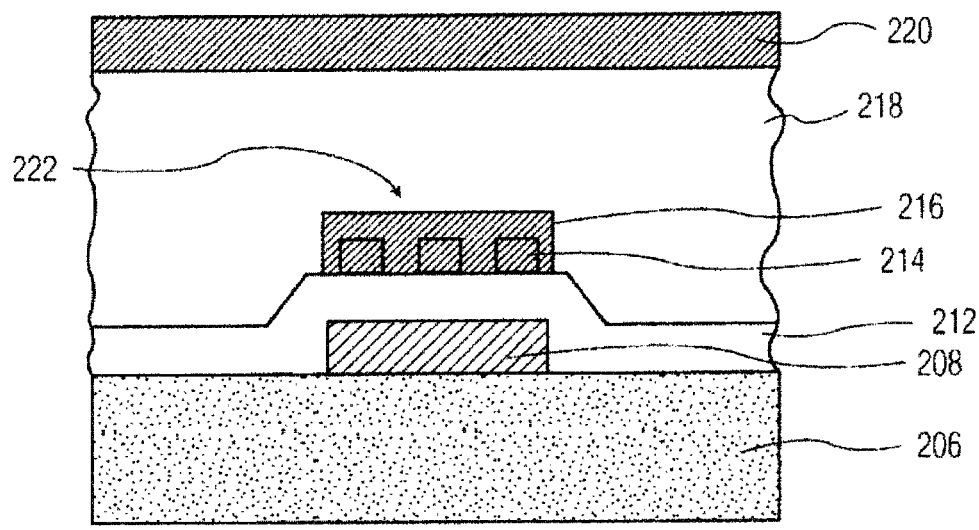
FIG. 6 is a cross-sectional view taken at section line 6-6 in FIG. 5 showing an illustrative stack for the active display pixel cell.

Referring to FIG.'s 5 and 6, one pixel of an active matrix circuit 204 using polymer electronics and a field shield embodied as a pixel pad 220 is illustratively shown in accordance with one embodiment. The dotted line indicates the position of the cross-sectional view in FIG. 6. In the embodiment, shown, a substrate 206, which may include a flexible polymer material or the like. A gate electrode 208 is formed from a conductive material, and an insulator 212 is formed over the gate electrode 208. Another conductive layer is patterned to form data line 214. The conductive layer used to form data line 214 may include other features as well, such as capacitor plates 221, via contact pads 223, etc. A semiconductor layer 216 is formed over and between data lines in an area designated for a thin film transistor 222. An insulator layer 218 is then formed over the thin film transistor 222 and the layer forming the data line 214. A pixel pad 220 is formed on the insulation layer 218. Pixel pad 220 forms a field shield and is disposed over the transistor 222 and portions of data line 214. Pixel pad 220 connects to transistor 222 through a portion of the data line layer 214 using via 225.

The field shield design is used to shield the electronic ink for the fields due to the voltages on the gate and data lines. As already mentioned, there is e.g. a kickback voltage of up to 90 V. If the electronic ink would "see" this voltage, it would have a detrimental effect on the lifetime. A second insulator layer (218) and the field shield electrode (220) are included but make fabrication more complex as described above.

Using ink jet printing as a deposition technique on non-porous substrates often requires a surface pre-treatment to prevent the applied droplets from spreading. The use of pores or surface energy patterns is quite common. The disadvantage of this procedure is that one or more lithographic steps (either microcontact printing or standard lithography) are needed. This minimizes the advantages of using a non-lithographic technique to apply a structured layer.

In accordance with an aspect of the present invention, cavities may be formed in a field shield insulator 218 as a mask to aid local application of semiconductor material 216. Next, an insulator is applied in the cavities followed by vapor deposition of a top conductive layer (e.g. gold). Also, vertical interconnects can be made using this approach as described below.

Figure 7:
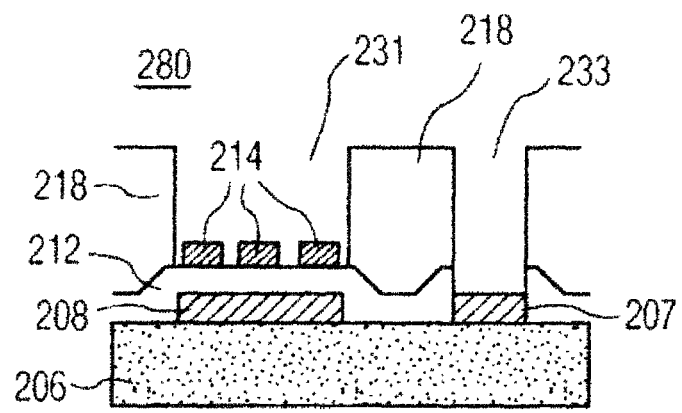
FIGS. 7-10 are cross-sectional views showing fabrication steps for an active matrix display showing ink jet printing of a semiconductor layer in accordance with an illustrative embodiment.

Referring to FIG. 7, substrate 206 has gate electrode 208 and a portion of a vertical interconnect 207. Both gate electrode 208 and interconnect 207 are formed from a same electrically conductive layer. Insulator 212 is formed over electrode 208 and interconnect and other portions of display device 280. Conductive material for data lines 214 is deposited and patterned followed by a deposition process which forms insulation layer 218. Cavities 231 are formed in insulation layer 218 to reveal portions of data line 214 over gate electrode 208. In addition, the insulation layers 212 and 218 are removed to expose interconnect 207 and form cavities 233. The insulating layers 212 and 218 can also be intrinsically photosensitive, which aids in their patterning and removal.

Figure 8:
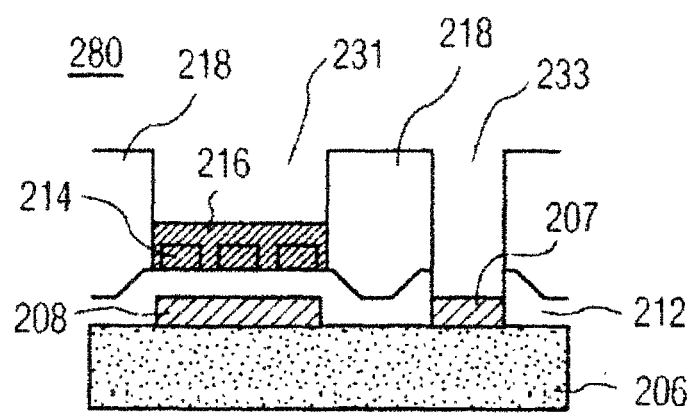

Referring to FIG. 8, semiconductor material 216 is applied to insulation layer 218 over gate electrode 208. Semiconductor material 216 is preferably applied using an ink jet printing process. Using ink jet printing as a deposition technique on non-porous substrates often requires a surface pre-treatment to prevent the applied droplets from spreading. The use of cavities 231 may be employed to help direct ink. Advantageously, ink is applied in predetermined areas or may be applied to the entire surface of the display device 208. In accordance with an aspect of the present invention, cavities 231 may be formed in a field shield insulator 218 as a mask to aid local application of semiconductor material 216.

Ink jet printing includes employing ink nozzles to dispense ink droplets over the surface of the display device 280. Advantageously, the ink jet process includes the ability to print only to designated areas of the device 280. In this way, the amount of semiconductor material 216 needed to form the active area of thin film transistors is significantly reduced. The semiconductor is the most expensive layer in the backplane of the display device. A reduction in material use can obtain a cost savings of two to three orders of magnitude for the bill of materials. Semiconductor material is suspended or dissolved into a carrier fluid and deposited by an ink jet process to form a semiconductor ink layer 216. This layer 216 will form the active region for a thin film transistor for the display device 280 when the ink layer dries.

Ink jet printing may include a single or multiple nozzle printing head and a solution of the semiconductor and a film forming agent Alternately, a precursor of the semiconductor may be included which after application is converted to the semiconductor using a heat treatment (see e.g., WO03030278, incorporated herein by reference).

Figure 9:
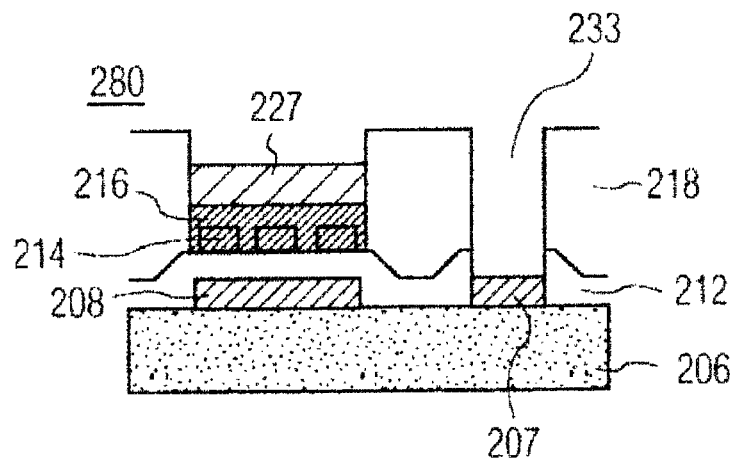

Referring to FIG. 9, an insulator 227 is applied in the cavities 231 to cover semiconductor layer 216. Insulator 227 is preferably applied using and ink jet printing process. Other print deposition techniques may also be employed.

Figure 10:
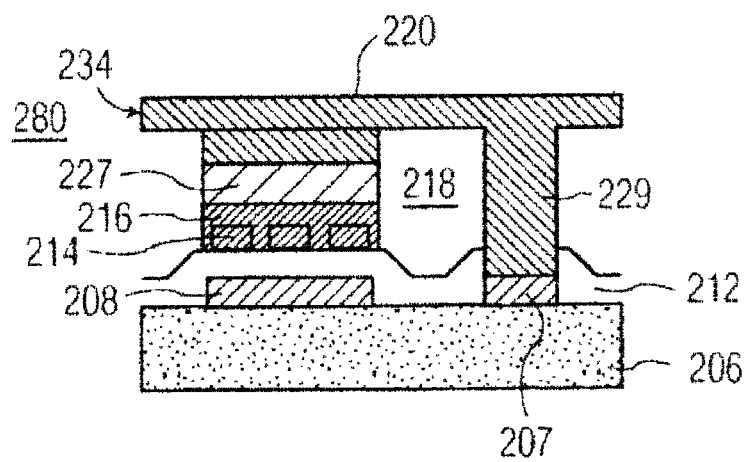

Referring to FIG. 10, a physical vapor deposition (PVD) of a top conductive layer 234 (e.g., gold or other conductive material) is performed. Conductive layer 234 forms pixel pad 220 and vertical interconnects 229. In addition, layer 234 (forming pixel pad 220) forms a second gate along with gate electrode 208 for the resulting thin film transistor 222 formed using semiconductor material 216. Pixel pad 220 may be connected to a drain of transistor 222.

By forming display device 280 in this way, it is possible to reduce the number of mask steps and simplify the procedure to apply and structure the semiconductor material 216. For example, the semiconductor may be spincoated and then a protective layer applied followed by a photoresist. This resist is patterned and may be used as a mask during a reactive ion etching step. By the present invention, the field shield insulator is patterned and the semiconductor material is inked jet printed followed by a dielectric deposition and conductor deposition. The subsequent patterning of the semiconductor material is avoided along with the complexity of the photoresist deposition and patterning steps.

Application areas of the present invention include display devices, including displays with inorganic and/or organic based materials. In particularly useful embodiments, plastic electronics based displays are fabricated in accordance with the present invention. While the present invention has been described in terms of a flexible display device, any display device may benefit from the teaching disclosed herein. Active-matrix displays using polymer electronics in active-matrix back planes may have other layers formed by ink jet printing.

Having described preferred embodiments for field shield dielectric as a mask during semiconductor ink jet printing (which are intended to be illustrative and not limiting), it is noted that modifications and variations can be made by persons skilled in the art in light of the above teachings. It is therefore to be understood that changes may be made in the particular embodiments of the disclosure disclosed which are within the scope and spirit of the embodiments disclosed herein as outlined by the appended claims. Having thus described the details and particularity required by the patent laws, what is claimed and desired protected by Letters Patent is set forth in the appended claims.

The invention claimed is:

1. A method for fabricating an active matrix backplane for an electrophoretic display device comprising electronic ink, comprising the steps of:
   providing a field shield dielectric layer arranged to protect the electronic ink from kickback voltages;
   patterning the field shield dielectric layer to expose conductors and form a cavity over the conductors;
   ink jet printing a semiconductor material to fill a portion of the cavity to cover the conductors to form a transistor for addressing a pixel without patterning the semiconductor material with a photolithography step;
   depositing an insulation material on the semiconductor material in the cavity, the insulation material providing an insulating cover for the semiconductor material in the cavity; and
   forming a pixel pad over the insulation material and the field shield dielectric layer.

2. The method as recited in claim 1, wherein the conductors include data lines and the step of patterning includes exposing the data lines.

3. The method as recited in claim 1, wherein the cavity is formed over a gate electrode.

4. The method as recited in claim 1, wherein the step of depositing an insulation material on the semiconductor material includes ink jet printing the insulation layer.

5. The method as recited in claim 1, wherein the conductors form a source and drain of a thin film transistor employed to turn a pixel on and off.

6. The method as recited in claim 5, wherein the conductors include a portion formed over and separated from a gate electrode by a dielectric layer.

7. The method as recited in claim 1, wherein the step of patterning a field shield dielectric layer to expose conductors and form a cavity over the conductors includes forming a cavity for a vertical interconnect.

8. The method as recited in claim 7, wherein the step of forming a pixel pad over the insulation material and the field shield dielectric layer includes forming the vertical interconnect using a same conductive material used to form the pixel pad.

9. The method as recited in claim 1, wherein the step of forming a pixel pad includes depositing a conductive material by physical vapor deposition.

10. A method for fabricating an active matrix backplane for an electrophoretic display device comprising electronic ink, comprising the steps of:
    forming a gate electrode;
    depositing a first insulation layer over the gate electrode;
    depositing a first conductive layer and patterning the first conductive layer to form data lines on the first insulation layer over the gate electrode; depositing a field shield dielectric layer arranged to protect the electronic ink from kickback voltages;
    patterning the field shield dielectric layer to expose the data lines and form a cavity over the gate electrode;
    ink jet printing a semiconductor material to fill a portion of the cavity and envelop the data lines without patterning the semiconductor material with a photolithography step;
    depositing a second insulation material on the semiconductor material, the second insulation material providing an insulating cover for the semiconductor material in the cavity; and
    forming a second conductive layer over the second insulation material and the field shield dielectric layer.

11. The method as recited in claim 10, wherein the step of depositing a second insulation material on the semiconductor material includes ink jet printing the second insulation layer.

12. The method as recited in claim 10, wherein the data lines form a source of a thin film transistor employed to turn a pixel on and off.

13. The method as recited in claim 10, wherein the step of patterning a field shield dielectric includes forming a cavity for a vertical interconnect.

14. The method as recited in claim 13, wherein the step of forming a second conductive layer includes forming the vertical interconnect using the second conductive layer.

15. The method as recited in claim 10, wherein the step of forming a second conductive layer includes depositing the second conductive layer by physical vapor deposition.

16. The method as recited in claim 10, wherein the step of forming a second conductive layer includes forming a pixel pad/field shield which extends over at least a portion of a thin film transistor formed using the semiconductor material.

17. An active matrix backplane for an electrophoretic display device comprising electronic ink, comprising:
    a thin film field effect transistor which selectably couples a signal to address a pixel, the thin film transistor including an ink jet printed semiconductor layer which covers source and drain conductors and the ink jet printed semiconductor layer is formed in a cavity formed in a field shield insulator layer arranged to protect the electronic ink from kickback voltages; and a pixel pad forming a field shield, the pixel pad being formed on an insulating layer and connected to the thin film field effect transistor through the insulating layer such that the field shield extends over at least a portion of the transistor; and an ink jet printed insulation layer deposited on the semiconductor layer, after forming the cavity in the field shield insulator layer, the ink jet printed insulation layer separating the ink jet printed semiconductor layer from the pixel pad.

18. The active matrix backplane, as recited in claim 17, wherein the ink jet printed insulation layer and the semiconductor layer are printed in a same cavity.

19. The active matrix backplane, as recited in claim 17, wherein the thin film transistor includes a gate electrode and the field shield is disposed over the thin film transistor to form a second gate electrode.

20. The active matrix backplane, as recited in claim 17, further comprising a vertical interconnect formed from a same material as the pixel pad.

21. The active matrix backplane, as recited in claim 17, wherein the display device is flexible.

22. An electrophoretic display device comprising the active matrix backplane of claim 17.

* * * * *